(12) United States Patent
Russell

(10) Patent No.: US 11,119,130 B2
(45) Date of Patent: Sep. 14, 2021

(54) SYSTEMS AND METHODS FOR INVESTIGATING A LOAD AND OBTAINING LOAD INFORMATION

(71) Applicant: Control4 Corporation, Salt Lake City, UT (US)

(72) Inventor: James K. Russell, Salt Lake City, UT (US)

(73) Assignee: Snap One, LLC, Salt Lake City, UT (US)

( * ) Notice: Subject to any disclaimer, the term of this patent is extended or adjusted under 35 U.S.C. 154(b) by 1447 days.

(21) Appl. No.: 13/914,841

(22) Filed: Jun. 11, 2013

(65) Prior Publication Data

US 2014/0365146 A1    Dec. 11, 2014

(51) Int. Cl.
  *G01R 21/06* (2006.01)
  *H02J 3/00* (2006.01)
  *H02J 13/00* (2006.01)

(52) U.S. Cl.
  CPC ............ *G01R 21/06* (2013.01); *H02J 3/00* (2013.01); *H02J 13/0062* (2013.01); *Y02E 60/00* (2013.01); *Y04S 40/124* (2013.01)

(58) Field of Classification Search
  CPC ...... G06F 11/3433; H04L 25/02; H04L 49/50; G01R 21/06; H02J 3/00; H02J 13/0062; Y04S 40/124
  See application file for complete search history.

(56) References Cited

U.S. PATENT DOCUMENTS

| 5,225,395 A * | 7/1993 | Tashiro | H02H 7/001 324/71.6 |
|---|---|---|---|
| 6,529,135 B1* | 3/2003 | Bowers | H02P 23/0077 318/806 |
| 2002/0117976 A1* | 8/2002 | Ortmeyer | H05B 41/282 315/291 |
| 2007/0057640 A1* | 3/2007 | Chung | H05B 41/3921 315/209 R |
| 2007/0247104 A1* | 10/2007 | Garza | H02P 27/16 318/807 |
| 2007/0268254 A1* | 11/2007 | Cheah | G06F 3/0317 345/166 |
| 2008/0218171 A1* | 9/2008 | Keith | H05B 41/36 324/414 |
| 2008/0270628 A1* | 10/2008 | Nekovee | H04L 67/04 709/247 |
| 2011/0234115 A1* | 9/2011 | Shimizu | H05B 33/0815 315/287 |
| 2012/0091902 A1* | 4/2012 | Radermacher | H05B 37/0272 315/159 |
| 2012/0235574 A1* | 9/2012 | Sumi | H05B 41/2985 315/131 |

(Continued)

*Primary Examiner* — Catherine T. Rastovski
*Assistant Examiner* — Liam R Casey
(74) *Attorney, Agent, or Firm* — Austin Rapp

(57) ABSTRACT

A computing device for investigating a load is described. The computing device includes a processor and executable instructions stored in memory that is in electronic communication with the processor. The computing device requests load driving data corresponding to a load that is driven by an electronic device. The computing device also receives the load driving data from the electronic device. The computing device further obtains load characterization data.

14 Claims, 9 Drawing Sheets

(56) References Cited

U.S. PATENT DOCUMENTS

| | | | |
|---|---|---|---|
| 2013/0057247 A1* | 3/2013 | Russell | G01R 21/006 323/318 |
| 2013/0170481 A1* | 7/2013 | Crawford | G01R 21/00 370/338 |
| 2013/0221867 A1* | 8/2013 | Deppe | H05B 45/37 315/224 |
| 2014/0191671 A1* | 7/2014 | Huang | H05B 45/37 315/186 |
| 2014/0265913 A1* | 9/2014 | Chung | H05B 33/0815 315/291 |
| 2015/0237695 A1* | 8/2015 | Jelaca | H05B 33/0815 315/291 |

\* cited by examiner

SYSTEMS AND METHODS FOR INVESTIGATING A LOAD AND OBTAINING LOAD INFORMATION

TECHNICAL FIELD

The present disclosure relates generally to electronic devices. More specifically, the present disclosure relates to systems and methods for investigating a load and obtaining load information.

BACKGROUND

In recent years, the price of electronic devices has decreased dramatically. In addition, the size of electronic devices has continued to decrease. Further, electronic devices continue to increase in capability and convenience.

Decreasing prices and increasing capabilities of electronic devices have permitted modern devices to be conveniently used in homes and businesses. Many homes and businesses include multiple electronic devices to assist in everyday tasks. While these electronic devices may provide convenience and entertainment, many also require control.

Electronic devices are often capable of driving one or more electrical loads. Electrical loads also consume energy and electrical power. Different loads may be driven by an electronic device in a variety of ways. With different loads having different characteristics and using different levels of energy consumption, the cost of energy consumption, such as electricity, may be a concern. Further, with the evolving nature and ever increasing number of load types, maintaining updated information on electronic devices and loads has become more difficult.

With more and more electronic devices and loads being used in homes and businesses, improved energy management features are needed. As illustrated in this discussion, improved energy management of electrical power consumption and communication of consumption information may be beneficial.

DETAILED DESCRIPTION

Figure 1:
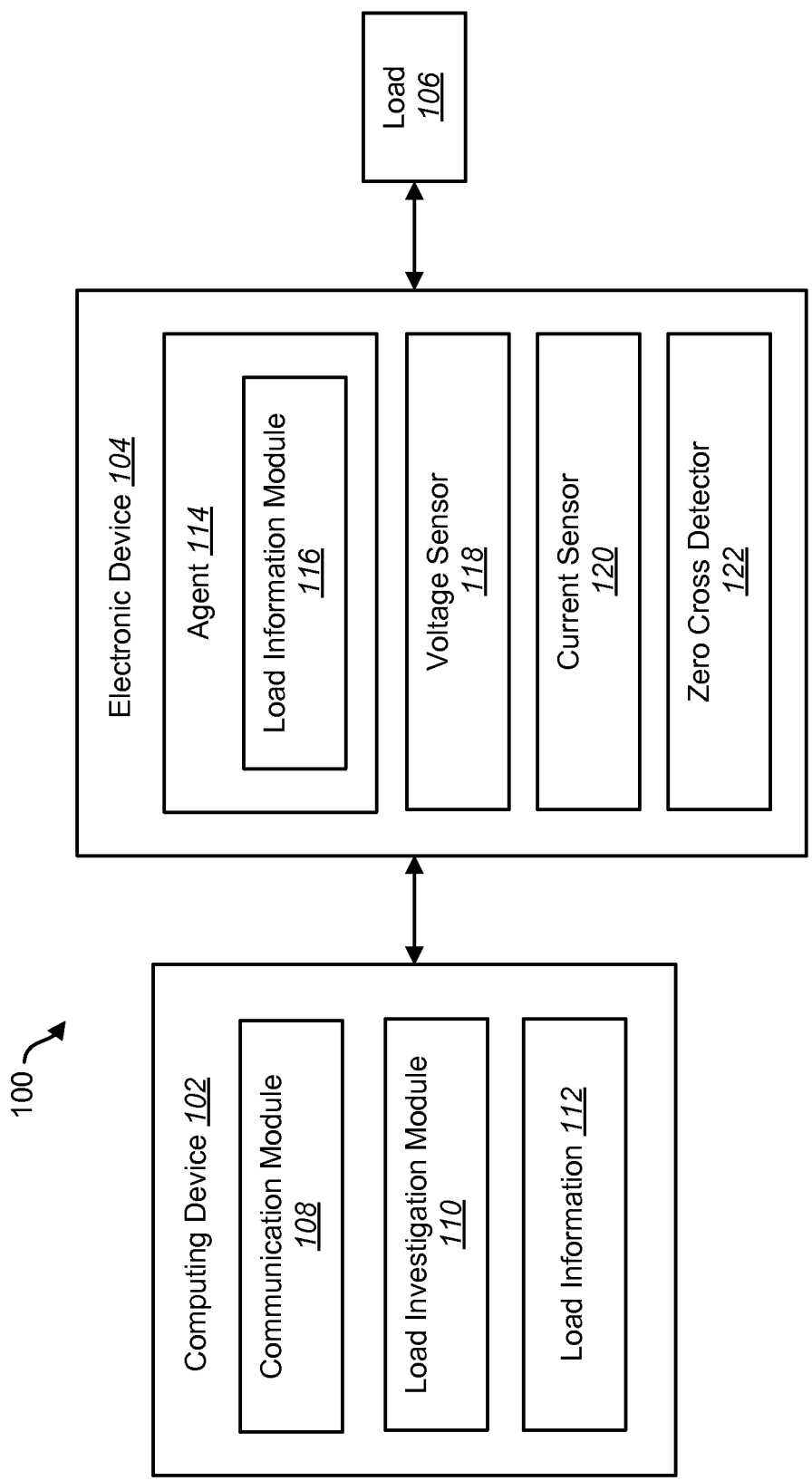
FIG. 1 is a block diagram illustrating one configuration of a computing device for investigating a load and obtaining load information.

A computing device for investigating a load is described. The computing device includes a processor and memory. The memory is in electronic communication with the processor. The computing device also includes instructions stored in memory. The instructions are executable to request load driving data corresponding to a load that is driven by an electronic device. The instructions are also executable to receive the load driving data from the electronic device. The instructions are also executable to obtain load characterization data.

The instructions may also be executable to evaluate compatibility of the load and the electronic device. Requesting and receiving the load driving data may occur over a remote connection. The electronic device may be one of a switch or a dimmer. The instructions may also be executable to instruct the electronic device to adjust operation of the load based on evaluating compatibility of the load and the electronic device.

Obtaining load characterization data may include determining whether the load driving data corresponds to a known load type. If it is determined that the load driving data corresponds to the known load type, then obtaining load characterization data may include obtaining load characterization data based on the known load type. If it is determined that the load driving data does not correspond to the known load type, then obtaining load characterization data may include generating load characterization data based on the load driving data.

Evaluating compatibility may include determining whether the load is compatible with the electronic device. If it is determined that the load is compatible with the electronic device, then the instructions may also be executable to update load information corresponding to the load that is driven by the electronic device. If it is determined that the load is not compatible with the electronic device, then evaluating compatibility may further include determining at least one incompatibility factor.

Obtaining load characterization data of the load may include determining a load type corresponding to the load. Requesting load driving data may also include instructing the electronic device to obtain load driving data based on a comparison of a voltage with respect to a current being fed to the load. The instructions may also be executable to update load information correspond to the load that is driven by the electronic device.

A method for investigating a load by a computing device is also described. The method includes requesting load driving data corresponding to a load that is driven by an electronic device. The method also includes receiving the load driving data from the electronic device. The method also includes obtaining load characterization data.

A non-transitory tangible computer-readable medium for investigating a load is also described. The computer-readable medium may include executable instructions for requesting load driving data corresponding to a load that is driven by an electronic device. The computer-readable medium may also include executable instructions for receiving the load driving data from the electronic device. The computer-readable medium may also include executable instructions for obtaining load characterization data.

The systems and method disclosed herein include a computing device for investigating a load and obtaining load information. For example, the computing device may communicate with an electronic device (e.g., switch, dimmer, etc.). The electronic device may drive a load. The computing device may obtain load information corresponding to the load driven by the electronic device.

Currently, there is an existing and growing need to test and qualify complex lighting loads for compatibility with electronic devices, such as solid state dimmers and switches. One way of testing a load has been to purchase a load and bring it to an on-site testing lab for compatibility testing to be performed. With the evolving nature of lighting load types, such as compact fluorescent and light emitting diode (LED) fixtures worldwide, the logistics and costs for continued compatibility testing of all these ever increasing types of loads continue to grow. Without properly investigating these various loads for compatibility with electronic devices, negative performance of the load and/or the electronic devices may result.

A computing device may be configured to investigate and obtain load information corresponding to a load driven by an electronic device. The computing device may be configured to investigate specific parameters or performance metrics of a load, such as inrush current, direct current (DC) offset current, power factor and other characteristics. These parameters may be considered in determining whether a load is being driven efficiently. Further, these and other factors may be considered when determining whether a load is operating incorrectly, or whether a load is incompatible with a specific configuration of an electronic device. In some instances, a computing device may request that an electronic device transmit load driving information and obtain specific parameters, such as inrush current, DC offset current, power factor and other characteristics from the load driving information provided by the electronic device driving the load.

The computing device may also utilize certain capabilities of an electronic device that is driving a load. For example, the electronic device may be configured to measure voltage and current waveforms, obtain power measurements and/or determine a power factor of a signal passing between the load and electronic device. Given these capabilities of an electronic device, a computing device may be configured (with a software utility, for example) to make use of these hardware capabilities of the electronic device to test and log parameters corresponding to a load. This information may be logged and evaluated by trained technicians on-site or by the device manufacturers for confirmation of load compatibility. A computing device may also obtain information about a load via the Internet or downloaded from other sources. In some configurations, the computing device may be configured to obtain known characteristics of a load type for internal investigation of the load by using a software utility.

By configuring the computing device to investigate and obtain information corresponding to a load, dealers and installers may gather and report statistics and parameters for new or unknown load types by make and model. Further, a computing device may make information corresponding to a load or system available to other computing devices to use in obtaining information about a load and/or electronic device. This may reduce the number of defective systems installed and deployed with compatibility issues. This may also assist installers or technicians in determining the overall health of a system for driving a load.

Various configurations are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the figures, is not intended to limit scope, as claimed, but is merely representative of the systems and methods. As used herein, the term "plurality" may indicate two or more. For example, a plurality of components refers to two or more components.

FIG. 1 is a block diagram illustrating one configuration of a computing device 102 for investigating a load 106 and obtaining load information 112. The computing device 102 may be implemented as part of a load investigating system 100. The load investigating system 100 may include a computing device 102 and an electronic device 104 driving a load 106. Examples of a computing device 102 may include servers, personal computers (PCs), laptop computers, tablet devices, smartphones or other kinds of computing devices. The computing device 102 may include one or more software utilities for performing the systems and methods described herein.

The computing device 102 may include a communication module 108. The communication module 108 may be a hardware and/or software module used to communicate with one or more electronic devices 104. In one configuration, the communication module 108 may be used to communicate with an electronic device 104 corresponding to a specific load 106. The computing device 102 may also include a load investigation module 110. The load investigation module 110 may be a hardware and/or software module implemented on the computing device 102. The load investigation module 110 may be used to perform various investigation functions in obtaining load driving data from an electronic device 104 about a load 106.

The computing device 102 may also include load information 112. The load information 112 may include data related to one or more loads 106, including a load 106 driven by a specific electronic device 104. The load information 112 may include characterization data corresponding to a load (e.g., load type) 106. The load information 112 may also include compatibility data corresponding to a load 106 and an electronic device 104. In some configurations, the load information 112 may be stored in a database on the computing device 102. Additionally or alternatively, the computing device 102 may obtain load information 112 from other sources, such as a remote database, or a combination of databases from multiple sources. Load information 112 may also be obtained by receiving load driving data from an electronic device 104 corresponding to the load 106. Using load driving data obtained from the electronic device 104, the computing device 102 may update the load information 112 corresponding to the load 106 being driven by the electronic device 104. The load driving data may be added to a load information database and/or stored by the computing device 102.

The load investigation system 100 may also include an electronic device 104. In some configurations, the electronic device 104 may be a dimmer or a switch. The computing device 102 may communicate with the electronic device 104 via a local connection or a remote connection and/or with a direct connection or indirect connection. The electronic device 104 may be configured to drive a load 106. The electronic device 104 may include an agent 114. The agent 114 may be implemented in a hardware and/or software on the electronic device 104 for obtaining load driving data and/or other information about a load 106. The agent 114 may include a load information module 116 for obtaining load driving data about a load 106. The load information module 116 may obtain load driving data that the electronic device 104 obtains while driving a load 106. The electronic device 104 may use the load information module 116 to communicate load driving data to the computing device 102.

The electronic device 104 may also obtain load driving data. For example, the electronic device 104 may include a voltage sensor 118, current sensor 120 and zero cross detector 122. The voltage sensor 118, current sensor 120 and zero cross detector 122 may include circuitry that is used by the electronic device 104 to obtain and/or evaluate load driving information. In some configurations, the voltage sensor 118, current sensor 120 and zero cross detector 122 may share circuitry (e.g., overlapping circuitry) for performing respective functions.

The voltage sensor 118 may capture a voltage waveform. For example, the voltage sensor 118 may capture a continuous time voltage waveform of an alternating current (AC) signal. The voltage sensor 118 may capture the voltage waveform directly via a line feed from a power source or by testing a node corresponding to a voltage waveform passing between the electronic device 104 and the load 106. The voltage sensor 118 may be used to measure how voltage varies over each cycle of an AC signal. In some configurations, the electronic device 104 may use an analog-to-digital (A/D) converter in connection with the voltage sensor 118 for capturing a discrete time (e.g., digital) voltage waveform of an AC signal by sampling a continuous time voltage waveform captured by the voltage sensor 118. For example, the analog-to-digital (A/D) converter may sample at sufficient intervals to capture how the voltage varies over one or more cycles of the AC signal passing between the electronic device 104 and the load 106.

The current sensor 120 may capture a current waveform. For example, the current sensor 120 may continuously capture a current waveform passing between the electronic device 104 and the load 106 over one or more AC cycles. The current sensor 120 may be configured to detect characteristics of the current passing between the electronic device 104 and load 106, such as in-rush current, peak fault conditions and other events/conditions that affect energy consumption of an electronic device 104 and/or performance of a load 106 being driven by the electronic device 104.

The zero cross detector 122 may be used to determine zero crossings of an AC signal. For example, the zero cross detector 122 may indicate the start and finish of one cycle of the AC signal. In one configuration, the zero cross detector 122 may be implemented using circuitry common to the voltage sensor 118 and the current sensor 120. The zero cross detector 122 may be used to align the sampling of the voltage waveform and the current waveform. For example, the samplings of the voltage sensor 118 and the current sensor 120 may align with reference to time so that a phase margin between a voltage waveform and current waveform of a signal passing between the electronic device 104 and the load 106 may be determined.

The zero cross detector 122 may also be used to determine a power measurement of an AC power frequency of a power source powering the load 106 and/or electronic device 104. For example, the zero cross detector 122 may detect the AC power frequency of a power source is 60 Hz. In another example, the zero cross detector 122 may detect that the AC power frequency of a power source is 50 Hz. In instances where a load 106 is designed for a 60 Hz source, and is being supplied by a 50 Hz source, the electronic device may drive the load 106 more efficiently by adjusting one or more settings associated with driving the load 106.

The electronic device 104 may include varying levels of functionality with regard to processing a signal passing between the electronic device 104 and load 106. In one example, the electronic device 104 may be capable of measuring a voltage waveform, a current waveform and determining a power rating of the load 106. In another example, the electronic device 104 may only be capable of capturing a voltage waveform, and communicating that data to the computing device 102 without further processing. In other words, the amount of data included in the load driving data communicated to the computing device 102 may be partially determined based on the capabilities or configurations of the electronic device 104. In some configurations, the computing device 102 may be configured to perform analysis on the signal passing between the electronic device 104 and the load 106, such as determining a phase margin, power rating or other data based on the amount of load driving information provided by the electronic device 104. Therefore, in some configurations, the computing device 102 may include similar functionality as the electronic device 104 for obtaining and analyzing load driving data.

Figure 2:
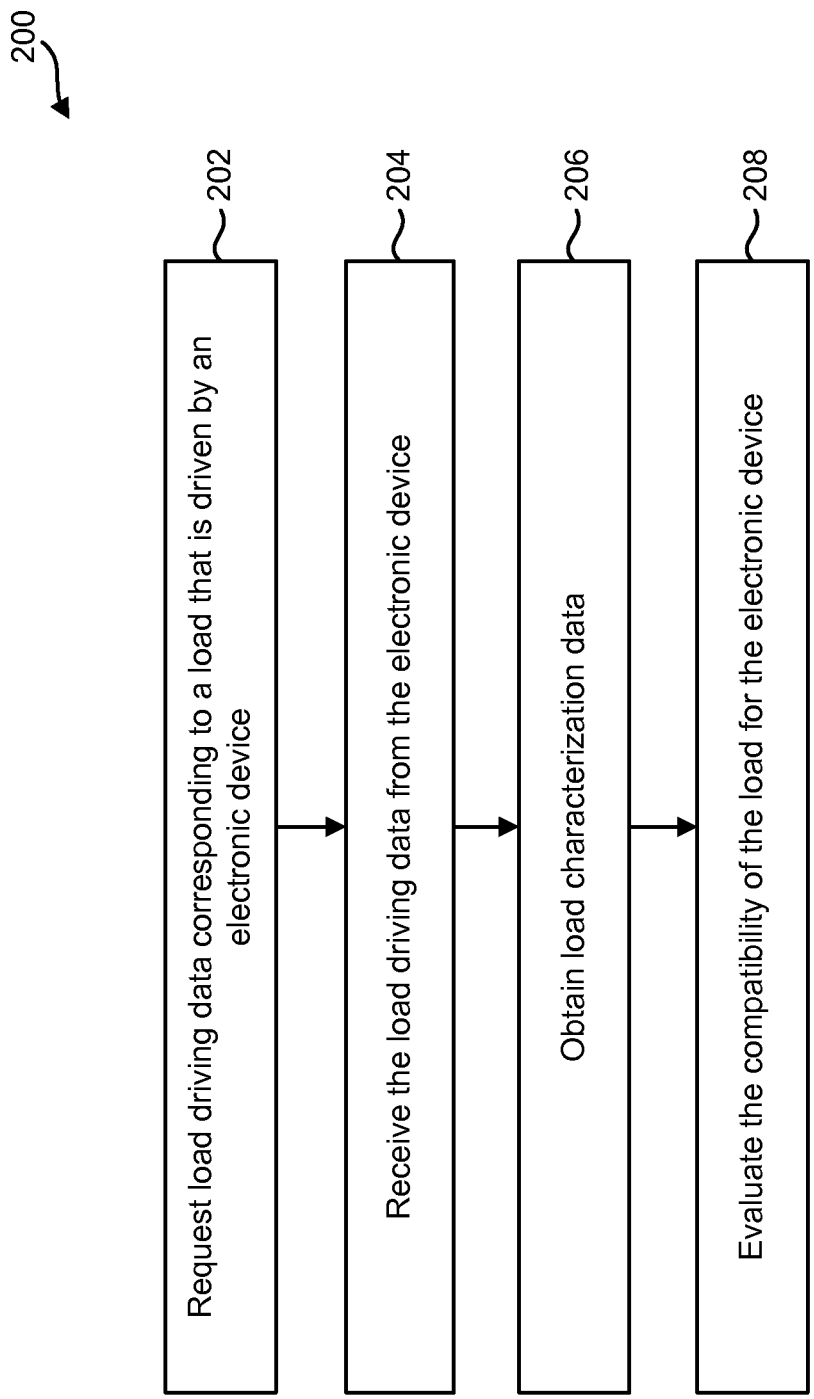
FIG. 2 is a flow diagram illustrating one configuration of a method for investigating a load and obtaining load information.

FIG. 2 is a flow diagram illustrating one configuration of a method 200 for investigating a load 106 and obtaining load information 112. A computing device 102 may request 202 load driving data from an electronic device 104. Requesting 202 the load driving data may include sending instructions to an electronic device 104 to obtain load driving data about the load 106. The request from the computing device 102 may include instructions to drive a load 106 and obtain information from driving the load 106. The request from the computing device 102 may also include instructions to obtain load driving data from past instances of the electronic device 104 driving the load 106. If the electronic device 104 has access to load driving data, such as data stored on a database or server, the request from the computing device 102 may also include instructions for the electronic device 104 to obtain or retrieve the load driving data and transmit the load driving data to the computing device 102.

The load driving data may correspond to a load 106 that is driven by an electronic device 104. The load driving data may include any information related to a load 106 coupled to or being driven by an electronic device 104. Additionally or alternatively, the load driving data may be raw (e.g., unprocessed) and/or may be processed (e.g., the load driving data may include calculated values and/or processed results) depending on a request for load driving data from the computing device 102 and/or the capabilities of the electronic device 104. Therefore, the load driving data may include a variety of data about a load 106. For example, the load driving data may include a voltage waveform and/or a current waveform passing between the electronic device 104 and the load 106. In obtaining a voltage waveform and a current waveform, the electronic device 104 may use a voltage sensor 118 and a current sensor 120. The voltage sensor 118 and current sensor 120 may capture the waveforms for additional processing by the electronic device 104 or the computing device 102. Additionally or alternatively, the load driving data may include a phase margin between the voltage waveform and current waveform and power or energy consumption information about the load 106. In some configurations, the electronic device 104 may be capable of determining the phase margin of a signal based on a voltage waveform and/or current waveform passing between the electronic device 104 and the load 106. In determining the phase margin and other power consumption data, the electronic device 104 may use a zero cross detector 122 for determining zero crossings of an AC signal. The zero cross detector 122 may consider the voltage waveforms and current waveforms to determine a phase margin or power rating of the signal passing between the electronic device 104 and the load 106. The electronic device 104 may also use other hardware functionality, such as analog-to-digital (A/D) converters, fault detection circuitry, microprocessors and other components for obtaining load driving data as requested by the computing device 102.

In some configurations, the computing device 102 may determine the phase margin and/or other additional load driving data in addition to the load driving data obtained by the electronic device 104. For example, where an electronic device 104 is capable of obtaining a voltage waveform and a current waveform, but incapable of obtaining a phase margin or other power or energy measurement, the electronic device 104 may provide some load driving data to the computing device 102, and the computing device 102 may obtain (e.g., determine, calculate and/or receive, etc.) additional load driving data about the load 106. The computing device 102 may then determine a phase margin or other load driving data related to a signal passing between the electronic device 104 and the load 106.

The computing device 102 may receive 204 the load driving data from the electronic device 104. The electronic device 104 may use a software agent 114 and/or a load information module 116 for providing the load driving data to the computing device 102. The computing device 102 may store the load driving data in a database and/or add the load driving data to load information 112 on the computing device 102.

The computing device 102 may obtain 206 load characterization data. Load characterization data may include load information 112 accessible to the computing device 102 and/or obtained based on the load driving data. Load characterization data may be any data that classifies a load 106 being driven by the electronic device 104. For example, the load characterization data may include a load type. The load type may classify a type of impedance of the load 106. For example, the load 106 may be a capacitive load, resistive load or inductive load. The load classification data may also include information about what kind of device the load 106 is. For example, the load 106 may be a light, motor, appliance or other device. Further, the characterization data may include more specific information, such as what kind of light, motor, appliance or other device is being driven by the electronic device 104. Examples of lights may include incandescent, arc, gas discharge, laser, fluorescent, light emitting diode (LED), sulfur or other kind of light capable of being driven as a load. Examples of motors may include ceiling fan, exhaust fan, pump or other kind of motor capable of being driven as a load. Examples of appliances may include stoves, refrigerators, heaters, air-conditioners or other appliances. Other devices may include computers, televisions, game consoles, wireless devices and semiconductor devices. In some instances, where a load 106 does not fall under a well-defined category, the computing device 102 may characterize the load by the impedance, power rating, part number, manufacturer and/or other load information 112 that may be used in characterizing the load 106 being driven by the electronic device 104.

In some configurations, the computing device 102 may evaluate 208 the compatibility of the load 106 for the electronic device 104. Evaluating 208 compatibility between a load 106 and electronic device 104 may include determining whether a load 106 is working. Evaluating 208 compatibility may also include determining whether a load 106 is being driven efficiently. If the computing device 102 determines that a load 106 is being driven efficiently, the computing device 102 may update the load information 112 with compatibility data corresponding to the load 106 to indicate efficient operating conditions of the load 106. If the computing device 102 determines that the load 106 is being driven inefficiently, the computing device 102 may update the load information 112 indicating conditions under which the load is driven inefficiently. The computing device 102 may also determine whether or not a load 106 and the electronic device 104 would be considered compatible or incompatible based on the load information 112 corresponding to the load 106 and/or load driving data provided to the computing device 102.

The computing device 102 may also perform additional steps, such as generating additional load information, updating a load information database, determining corrective steps for driving the load 106 more efficiently and instructing the electronic device 104 to adjust one or more settings in driving the load 106. In this way, the computing device 102 may perform information gathering functions, diagnostic functions and corrective functions to adjust how a load 106 is driven. Further, the computing device 102 may perform this method, including some or all of the steps described herein, periodically or continually to monitor characteristics of the load 106 and to maintain updated load information 112 corresponding to the load 106 and electronic device 104. In some configurations, the computing device 102 may obtain load characterization data and evaluate the compatibility between the electronic device 104 and the load 106 in response to a request from an electronic device 104 for load information 112 and/or compatibility analysis corresponding to the load 106.

Figure 3:
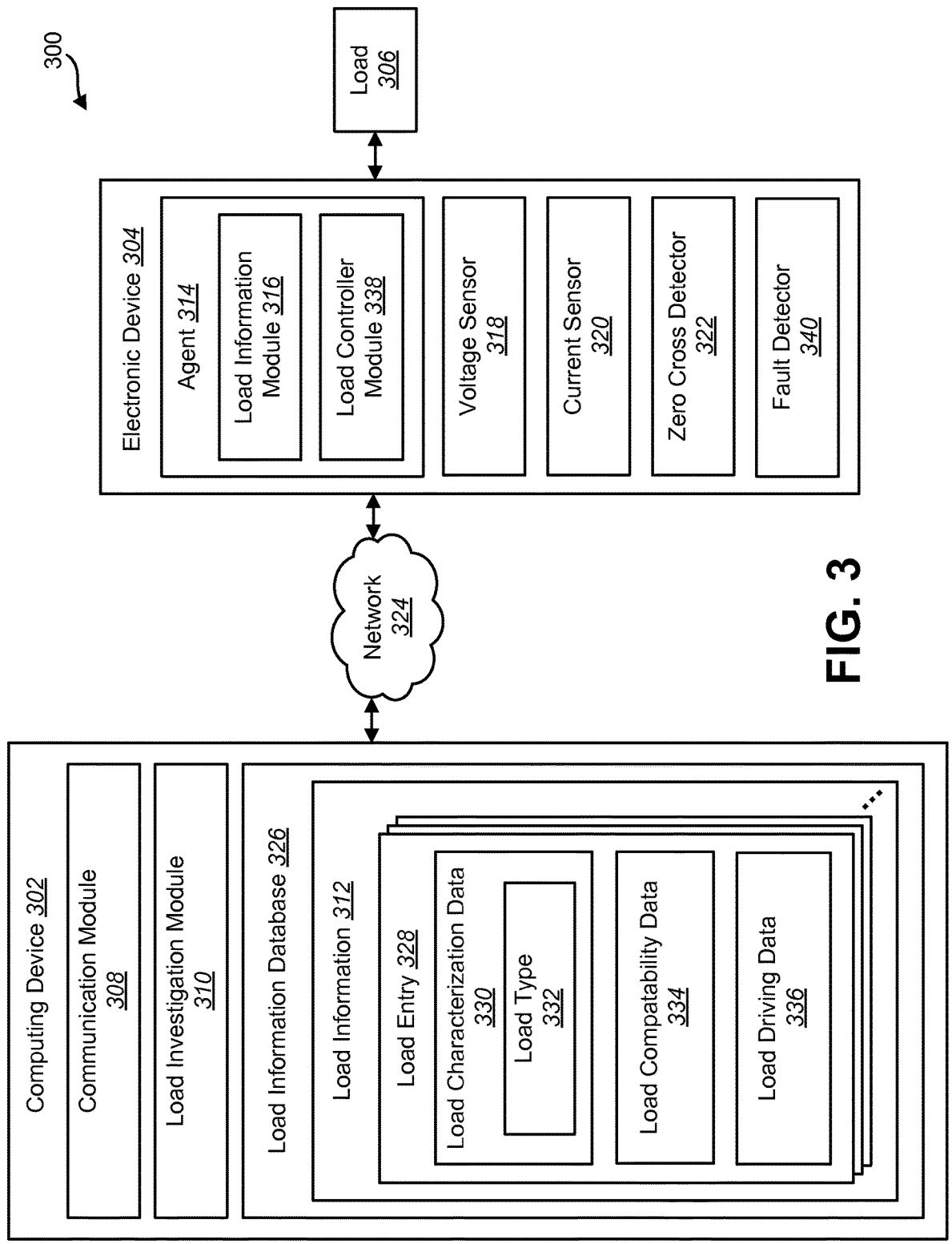
FIG. 3 is a block diagram illustrating another configuration of a computing device for investigating a load and obtaining load information.

FIG. 3 is a block diagram illustrating another configuration of a computing device 302 for investigating a load 306 and obtaining load information 312. The computing device 302 may be implemented as part of a load investigating system 300. The load investigating system 300 may include a computing device 302 and an electronic device 304 driving a load 306. The load investigating system 300, including the computing device 302 and the electronic device 304 may be one configuration of the load investigating system 100 described above in connection with FIG. 1.

The computing device 302 may include a communication module 308 for communicating with the electronic device 304. The computing device 302 may communicate with the electronic device 306 over a network 324. The network 324 may be a computer network such as a Local Area Network (LAN), Wide Area Network (WAN), Internet, Intranet or other medium for transferring data between a computing device 302 and an electronic device 304. In some configurations, the network 324 may be used to communicate with multiple electronic devices, each driving one or more loads. The computing device 302 may also include a load investigation module 310. The load investigation module 310 may be used to perform various investigation functions in obtaining load driving data 336 from the electronic device 304 over the network 324.

The computing device 302 may include a load information database 326. The load information database 326 includes load information 312 corresponding to one or more loads. The load information database 326 may be on the computing device 302 or on another device accessible to the computing device 302. In some configurations, the load information database 326 may be shared by multiple computing devices, with load information accessible to each computing device.

The load information 312 may include one or more load entries 328. Each load entry 328 may correspond to a load 306 that is driven by an electronic device 304. A load entry 328 may include load characterization data 330. The load characterization data 330 may include a load type 332. The load characterization data 330 may also include other characterizing data, such as impedance properties of a load, part number, model number, specifications and/or other information related to the identity or characteristics of the load 306. Further, the load characterization data 330 may also include information about the specific kind of load 306, such as what kind of light, motor, appliance or other device is being driven by the electronic device 304. The load characterization data 330 may also include information related to the relationship between the electronic device 304 and the load 306. For example, where a load 106 is paired with an electronic device 304 that is a switch, the load 306 may be driven differently than when the electronic device 304 is a dimmer. The computing device 302 may take this into account when generating or updating a load entry 328 corresponding to the pair of the electronic device 304 and the load 306.

Each load entry 328 may also include load compatibility data 334. The load compatibility data 334 may be used to evaluate the compatibility between a load 306 and electronic device 304. The load compatibility data 334 may be used to determine whether a load 306 is working correctly. The load compatibility data 334 may also be used to determine whether a load 306 is being driven efficiently or inefficiently. The load compatibility data 334 may also be used to determine one or more incompatibility factors that are contributing to whether a load 306 is operating correctly or efficiently in connection with the electronic device 304. The computing device 302 may use the load compatibility data 334 corresponding to a particular load 306 to determine adjustments that may be made from the electronic device 304 in driving the load 306.

The load information database 326 may also include load driving data 336 received from the electronic device 304. The load driving data 336 may include specific measurements or analysis related to the electronic device 304 driving the load 306. The load driving data 336 may be obtained from the electronic device 304 and stored in the load information database 326. The load driving data 336 may be compared to the load characterization data 330 or the load compatibility data 334 to determine whether a corresponding load entry 328 exists for a particular load 306. The load driving data 336 may also be used to update a load entry 328. This may be done by storing the load driving data 336 as part of the load entry 328 corresponding to the load 306. In cases where the load 306 does not already have a corresponding load entry 328, the load driving data 336 may also be used to generate a new load entry 328 corresponding to a load 306 that is driven by an electronic device 304.

The load information database 326 may include any number of load entries 328 corresponding to one or more loads 306 and/or electronic devices 304. Each load entry 328 may include additional data related to the load 306 and any information that would assist the computing device 302 in characterizing the load 306 or evaluating compatibility of the load 306 and electronic device 304. The computing device 302 may store the load information 312 locally for later access by the computing device 302. The computing device 302 may also share load information 312, including load entries 328 and corresponding data, with other computing devices 302 and electronic devices 304 that may be driving similar loads 306. This load information 312 may be shared with other devices via the network 324 or other connection available for transmitting data to other devices.

The load investigation system 300 may also include an electronic device 304. In some configurations, the electronic device 304 may be a dimmer or a switch. The computing device 302 may communicate with the electronic device 304 via a local connection or a remote connection and/or a direct connection or indirect connection. The electronic device 304 may be configured to drive a load 306. The electronic device 304 may include an agent 314. The agent 314 may be implemented in a hardware and/or software on the electronic device 304 for obtaining load driving data and/or other information about a load 306. The agent 314 may include a load information module 316 for obtaining load driving data 336 about a load 306. The load information module 316 may obtain load driving data 336 that the electronic device 304 obtains while driving a load 306. The electronic device 304 may use the load information module 316 to communicate load driving data 336 to the computing device 302.

The agent 314 may also include a load controller module 338 for controlling how a load 306 is driven. In some configurations, the electronic device 304 may receive instructions regarding how to drive a load 306. The electronic device 304 may also receive additional load information 312 that may assist the agent 314 in determining any adjustments that may be made to driving a load 306. The load controller module 338 may be used to make any adjustments necessary for increasing the efficiency of a load 306 or to solve any problems associated with driving the load 306. The load controller module 338 may also be used to apply certain settings for controlling the load 306 and/or disengaging the load 306 to protect the electronic device 304 and/or the load 306. For example, the computing device 302 may provide instructions to the electronic device 304 to disengage operation of the load 306 if a certain operating condition that may be detrimental to the electronic device 304 or the load 306 is present. The electronic device 304 may then use the load controller module 338 to disengage or adjust operation of the load 306 based on the presence or absence of certain operating conditions pursuant to instructions provided by the computing device 302.

The electronic device 304 may also obtain load driving data 336. For example, the electronic device 304 may include a voltage sensor 318, current sensor 320, zero cross detector 322 and fault detector 340. The voltage sensor 318 and the current sensor 320 may be used to capture a voltage waveform and a current waveform and detect certain conditions related to the voltage and current of a signal passing between the electronic device 304 and the load 306. The zero cross detector 322 may be used to determine zero crossings of an AC signal and a phase margin between the voltage waveform and the current waveform. Voltage waveforms, current waveforms, zero crossings, phase margins and/or other metrics may be used to determine compatibility of the load 306 and the electronic device 304. The voltage waveforms, current waveforms, zero crossings, phase margins and/or other metrics may also be used to determine and/or make adjustments to improve compatibility between the load 306 and electronic device 304. Furthermore, voltage, current, zero crossings, phase margins and/or other measurements and calculations may also be used in obtaining load driving data 336 to be sent to the computing device 302 to be added to the load information 312 corresponding to the load 306.

The fault detector 340 may be used to determine certain fault conditions, such as current spikes, irregularities or whether a current passing between the electronic device 304 and the load 306 exceeds a certain threshold. In some cases, the fault detector 340 may include functionality for detecting and tracking a number of fault conditions to assist the computing device 302 in determining whether a load 306 is compatible with an electronic device 304. The fault detector 340 may also be configured to disengage operation between the electronic device 304 and the load 306 in order to protect the load 306 and/or the electronic device 304 from damage due to high currents passing through the load 306 and electronic device 304. In some configurations, the fault conditions provided from the fault detector 340 may be used to obtain load characterization data 330 and evaluate compatibility between the load 306 and electronic device 304.

Figure 4:
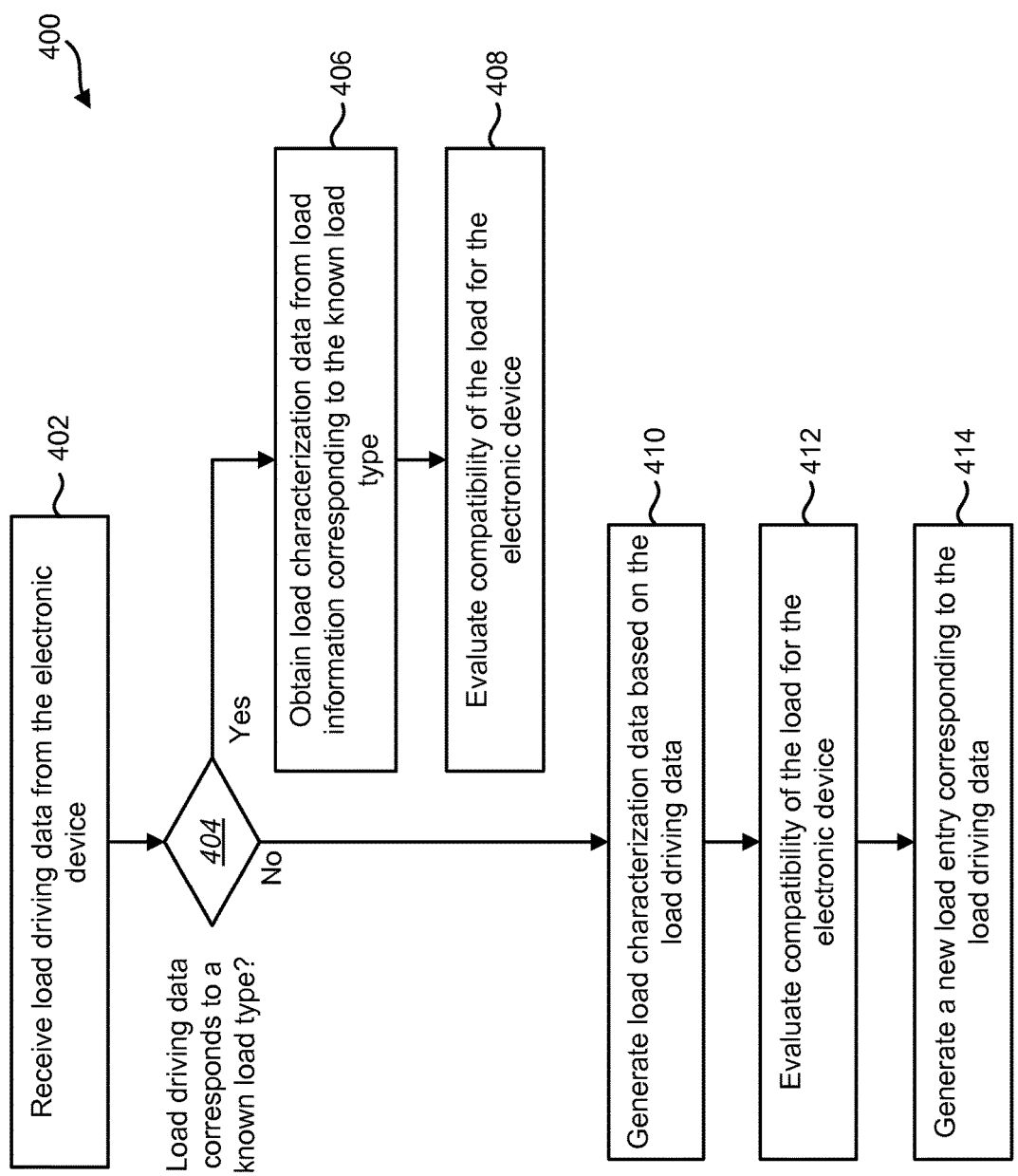
FIG. 4 is a flow diagram illustrating a more detailed configuration of a method for investigating a load and obtaining load information.

FIG. 4 is a flow diagram illustrating a more detailed configuration of a method 400 for investigating a load 306 and obtaining load information 312. The method 400 may include requesting load driving data 336 from an electronic device 304. The method 400 may also include receiving 402 load driving data 336 from the electronic device 304. The electronic device 304 may use a software agent 314 and/or a load information module 316 for transmitting the load driving data 336 to the computing device 302. The computing device 302 may store the load driving data 336 in a load information database 326 and/or add the load driving data 336 to load information 312 accessible to the computing device 302.

The computing device 302 may determine 404 whether the received load driving data 336 corresponds to a known load type 332. Determining 404 whether the load driving data 336 corresponds to a known load type 332 may include comparing the received load driving data 336 to load information 312 accessible to the computing device 302. The load information 312 may include one or more load entries 328 with load information 312 corresponding to known load types 332. If the received load driving data 336 corresponds to a load entry 328 with load characterization data 330 or other load information 312 that corresponds to the received load driving data 336, the computing device 302 may determine that the load 306 is a known load type 332. Determining that a load 306 is known may include finding an exact match with another load type 332 or may be based on a comparison between the load 306 being driven and a load entry 328 with results that approximate the received load driving data 336 corresponding to the load 306. The computing device 302 may use a variety of criteria for determining whether the load driving data 336 is a match with a known load type 332.

If the load driving data 336 corresponds to a known load type 332, the computing device 302 may obtain 406 load characterization data 330. The computing device 302 may obtain 406 the load characterization data 330 from the load information 312 or load entry 328 corresponding to the known load type 332. The computing device 302 may obtain the load characterization data 330 from a load information database 326. The load information database 326 may be located on the computing device 302. The load information database 326, including the load characterization data 330, may also be located on a separate database from the computing device 102. In some configurations, the computing device 102 may obtain the load characterization data 330 from other sources, such as a local database, remote database or Internet server.

The computing device 302 may also evaluate 408 compatibility of the load 306 for the electronic device 304. The computing device 302 may evaluate 408 compatibility of the load 306 and the electronic device 304 using load information 312 on the load information database 326. Evaluating 408 compatibility may include determining whether a load 306 is working, determining whether a load 306 is being driven efficiently and/or other evaluations of the relationship between the electronic device 304 and the load 306. In some configurations, the computing device 302 may also update the load information 312 based on the received load driving data 336.

If the load driving data 336 does not correspond to a known load type 332, the computing device 302 may generate 410 load characterization data 330 based on the load driving data 336 received from the electronic device 304. The generated load characterization data 330 may be added to the load information database 326. In some configurations, generating 410 load characterization data 330 may include identifying a load type 332 and/or determining one or more characteristics of the load 306 based on the received load driving data 336.

The computing device 302 may also evaluate 412 compatibility of the load 306 for the electronic device 304. Evaluating 412 compatibility between a load 306 and electronic device 304 may include determining whether a load 306 is working. Evaluating 412 compatibility may also include determining whether a load 306 is being driven efficiently. In some configurations, such as where the load 306 does not correspond to a known load type 332, evaluating 412 compatibility of the load 306 may be based on the load driving data 336 provided by the electronic device 304.

Where the load driving data 336 does not correspond to an already existing load entry 328, the computing device 302 may generate 414 a new load entry 328 corresponding to the load driving data 336. The load entry 328 may then be used in future cases where the same load 306 or similar load type 332 is used. If the method 400 is then repeated, a similar or identical load 306 will correspond to a known load type 332, and the computing device 302 may obtain load characterization data 336 and evaluate compatibility of similar load types 332 based on the load information 312 from the generated load entry 328.

Figure 5:
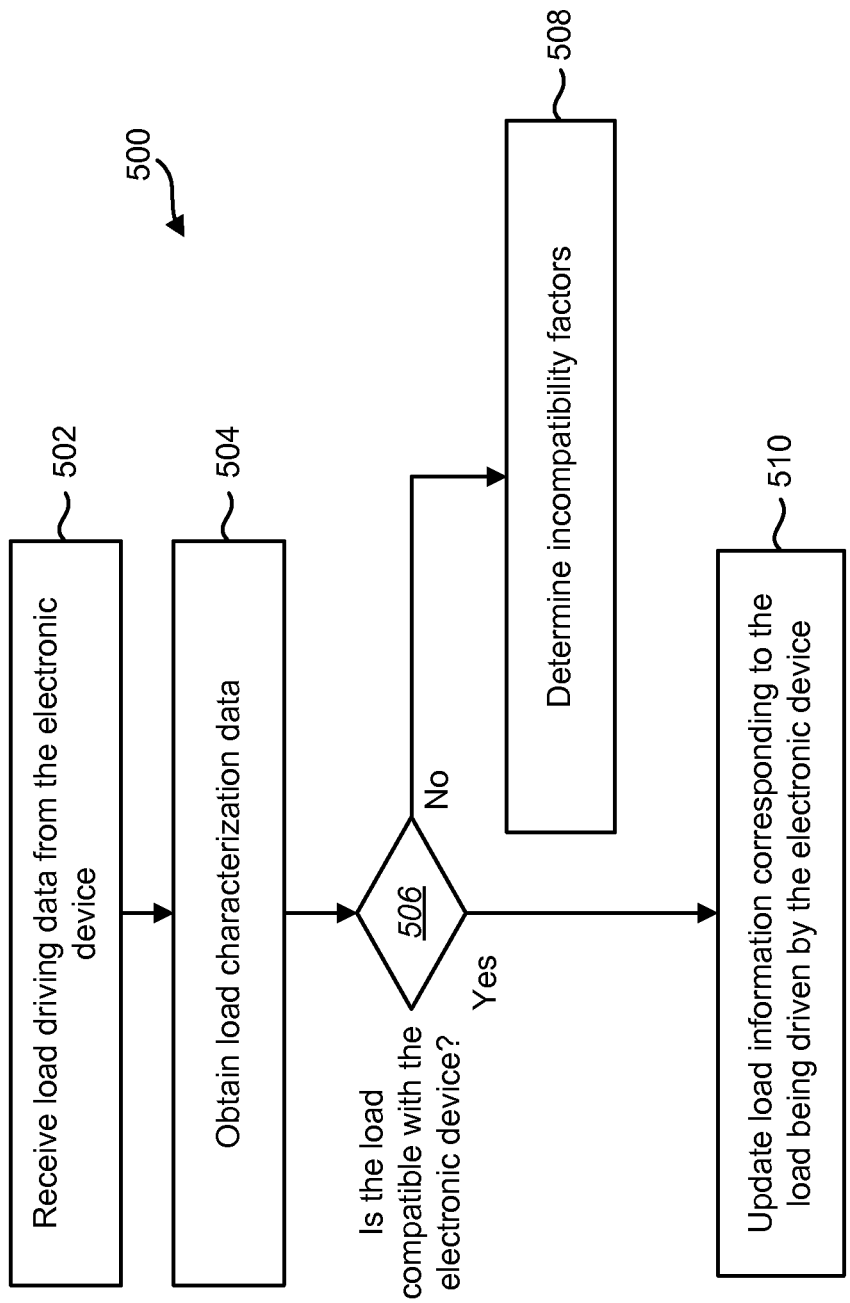
FIG. 5 is a flow diagram illustrating another more detailed configuration of a method for investigating a load and obtaining load information.

FIG. 5 is a flow diagram illustrating another more detailed configuration of a method 500 for investigating a load 306 and obtaining load information 312. The method 500 may include requesting load driving data 336 from an electronic device 304. The method 500 may also include receiving 502 load driving data 336 from the electronic device 304. The electronic device 304 may use a software agent 314 and/or a load information module 316 for providing load driving data 336 to the computing device 302. The computing device 302 may store the load driving data 336 in a load information database 326 and/or add the load driving data 336 to load information 312 accessible to the computing device 302.

The computing device 302 may also obtain 504 load characterization data 330. Obtaining 504 load characterization data 330 may include determining whether the received load driving data 336 corresponds to a known load type 332. Obtaining 504 load characterization data 330 may also include determining the load type 332 or other load characteristic data based on the load driving data 336 received from the electronic device 304.

The computing device 302 may evaluate the compatibility of the load 306 for the electronic device 304. Evaluating compatibility may include determining 506 whether the load 306 is compatible with the electronic device 304. Determining 506 whether the load 306 is compatible may include determining whether the load 306 is working correctly in connection with the electronic device 304. Determining 506 compatibility may also include determining whether a load 306 is being driven efficiently or inefficiently by the electronic device 304. Determining whether a load 306 is being driven efficiently or inefficiently may include comparing a variety of criteria. Examples of criteria may include predetermined power ratings, phase margins and/or comparisons of load information 312 corresponding to other similar load types 332 in a load information database 326.

If the computing device 302 determines 506 that the load 306 is incompatible with an electronic device 304, the computing device 302 may determine 508 incompatibility factors. Incompatibility factors may be one or more factors that are contributing to the lack of compatibility between the load 306 and the electronic device 304. Examples of incompatibility factors may include using high amounts of consumed energy, current and voltage waveforms being out of sync, power source problems, lack of functionality, an elevated number of current faults and/or other errors being detected or other factors that may contribute to the load functionality and/or efficiency of driving the load 306.

If the computing device 302 determines that the load 306 is compatible with the electronic device 304, the computing device 302 may update 510 load information 312 corresponding to the load 306 and the electronic device 304. Updating 510 the load information 312 may include generating a new load entry 328 corresponding to the load 306. Updating 510 the load information 312 may also include adding or updating a load entry 328 having load information 312 corresponding to the load 306 or similar load types 332. Updating 510 the load information 312 may also include noting or comparing differences between the efficiency of similar loads being driven by different electronic devices.

Figure 6:
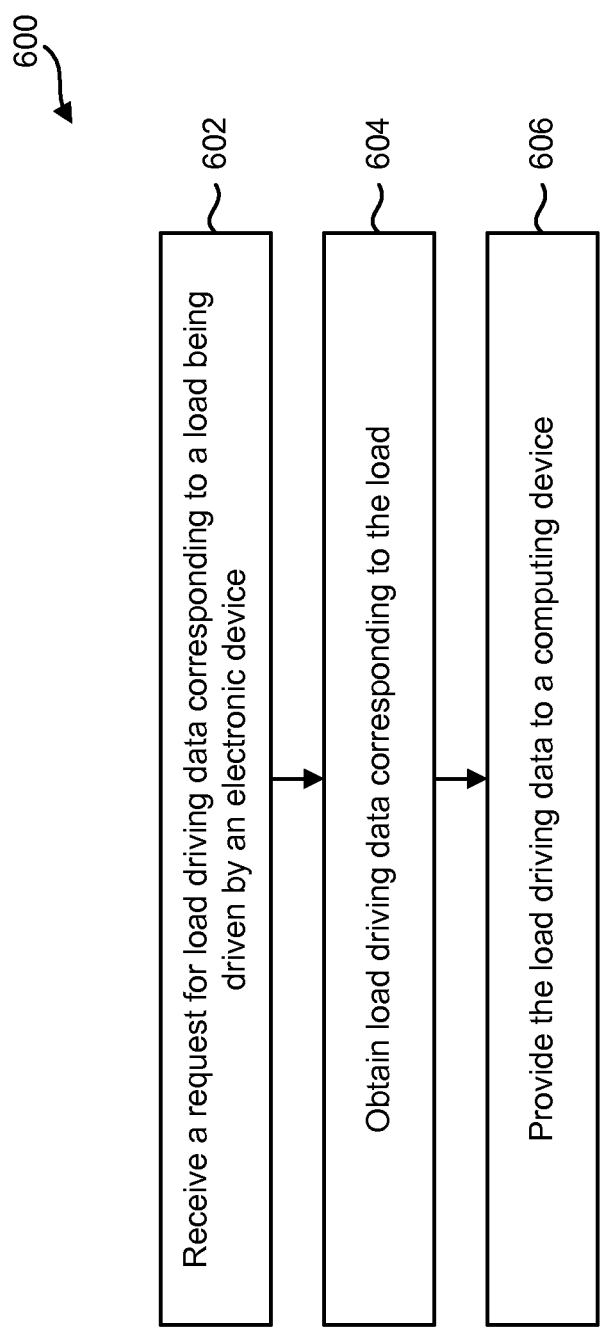
FIG. 6 is a flow diagram illustrating yet another more detailed configuration of a method for investigating a load and obtaining load information.

FIG. 6 is a flow diagram illustrating yet another more detailed configuration of a method 600 for investigating a load 306 and obtaining load information 312. The method 600 may include communicating between a computing device 302 and an electronic device 304. The electronic device 304 may receive 602 the request for load driving data 336 corresponding to a load 306 being driven by the electronic device 304. The request from the computing device 302 may include instructions for the electronic device 304 about obtaining load driving data 336 corresponding to a load 306. The request may include instructions regarding a specific amount and/or type load driving data to obtain and other instructions regarding driving a load 306 and obtaining load driving data 336 or load information 312 about the load 306.

The electronic device 304 may obtain 604 load driving data 336 corresponding to the load 306. Obtaining 604 load driving data 336 may include observing and obtaining data from driving a load 306 connected to the electronic device 304. The load driving data 336 may be obtained from driving a load 306 and/or obtaining load driving data from previous instances of driving a load 306. Obtaining 604 load driving data 336 may include measuring a voltage waveform and a current waveform. The electronic device 304 may also obtain a phase margin and power rating based on the voltage waveform and current waveform. In some configurations, the electronic device 304 may detect and compile information about certain fault conditions, such as current spikes, over current and the current waveform exceeding certain threshold values during operation of a load 306.

The electronic device 304 may obtain varying levels of load driving data 336 depending on the functionality of the electronic device 304. For example, the electronic device 304 may be configured to measure a voltage waveform and a current waveform without determining a phase margin or other analysis of the waveforms. In other configurations, the electronic device 304 may perform a more in depth analysis of the operating conditions of the load 306, including determining power measurements, fault conditions and certain inefficiencies in driving the load 306. The load driving data 336 may include any information related to the operation or driving of the load 306 by the electronic device 304.

The electronic device 304 may provide 606 the load driving data 336 to the computing device 302. Providing 606 the load driving data 336 to the computing device 302 may include using an agent 314 (e.g., software agent) or other application for transmitting the load driving data 336 to the computing device 302.

Figure 7:
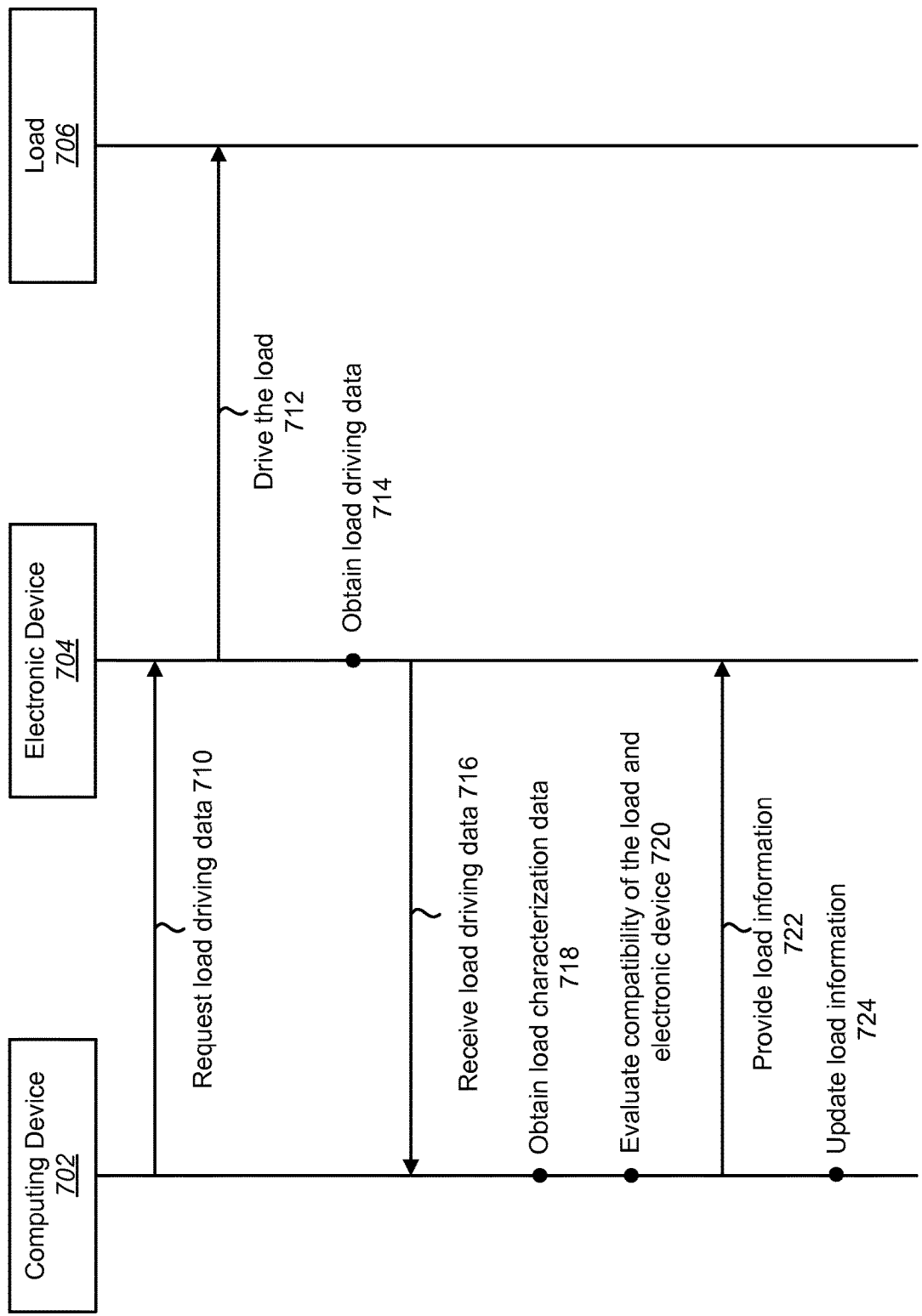
FIG. 7 is a thread diagram illustrating one example of investigating a load and obtaining load information.

FIG. 7 is a thread diagram illustrating one example of investigating a load 706 and obtaining load information 312. A computing device 702 may request 710 load driving data 336 from an electronic device 704. The electronic device 704 may drive 712 the load 706. Driving 712 the load 706 may be in response to the request for load driving data 336 or may be independent of any communication with the computing device 702. The electronic device 704 may obtain 714 load driving data 336. Obtaining 714 the load driving data 336 may include measuring and/or analyzing data observed by the electronic device 704 while driving the load 706. The electronic device 704 may transmit the load driving data 336 to the computing device 702.

The computing device 702 may receive 716 the load driving data 336 from the electronic device 704. The computing device 702 may obtain 718 load characterization data 330 corresponding to the load 706. The load characterization data 330 may be obtained from the received load driving data 336. The load characterization data 330 may also be obtained from comparing the load driving data 336 to load information 312 on a load information database 326 to determine if there is a known load type 332 corresponding to the load 706 being driven by the electronic device 704. The computing device 702 may also evaluate 720 compatibility of the load 706 and the electronic device 704. Evaluating 720 the compatibility of the load 706 and electronic device 704 may be based on known load information 312 corresponding to the load 706 and electronic device 704 and/or may be based on the load driving data 336 provided to the computing device 702. In some configurations, the computing device 702 may evaluate 720 compatibility of the load 706 and electronic device 704 based on a combination of load information 312 and load driving data 336 received from the electronic device 704.

The computing device 702 may provide 722 load information 312 to the electronic device 704. The load information 312 may be provided for assisting the electronic device 704 in driving the load 706 more efficiently. In addition to providing 722 load information 312, the computing device 702 may also instruct the electronic device 704 to adjust the operation of the load 706 based on load information 312 corresponding to the load 706 and electronic device 704. The computing device 702 may also update 724 the load information 312 corresponding to the load 706. Updating 724 the load information 312 may include adding load information 312 or load driving data 336 to a load information database 326 and/or making any updated load information 312 available to other computing devices.

Figure 8:
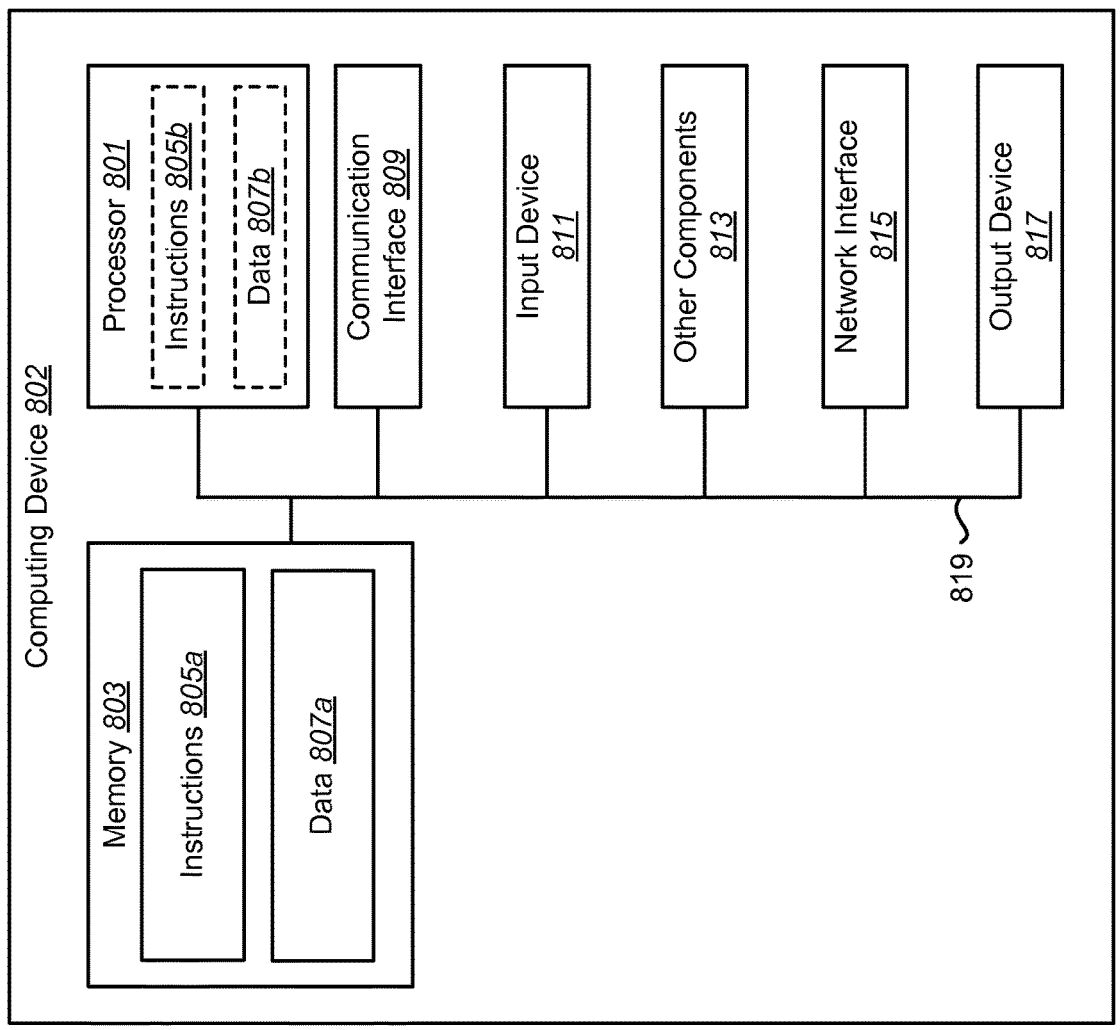
FIG. 8 is a block diagram illustrating various components that may be utilized in a computing device.

FIG. 8 is a block diagram illustrating various components that may be utilized in a computing device 802. One or more of the computing devices described herein may be implemented in accordance with the computing device 802 described in connection with FIG. 8. Although only the computing device 802 is shown, the configurations herein may be implemented in a distributed system using many computing devices. A computing device 802 may include the broad range of digital computers, including microcontrollers, hand-held computers, personal computers, servers, mainframes, supercomputers, minicomputers, workstations and any variation or related device thereof. In some configurations, the computing device 802 may be an appliance. Additionally or alternatively, the computing device 802 may be an embedded device inside an otherwise complete device (e.g., within an appliance).

The computing device 802 is shown with a processor 801 and memory 803. The processor 801 may control the operation of the computing device 802 and may be embodied as a microprocessor, a microcontroller, a digital signal processor (DSP) or other device known in the art. The processor 801 typically performs logical and arithmetic operations based on program instructions 805a and/or data 807a stored within the memory 803. The instructions 805a in the memory 803 may be executable to implement the methods described herein. FIG. 8 illustrates instructions 805b and/or data 807b being loaded onto the processor 801. The instructions 805b and/or data 807b may be the instructions 805a and/or data 807a (or portions thereof) stored in memory 803.

The computing device 802 may also include one or more communication interfaces 809 and/or network interfaces 815 for communicating with other computing and/or electronic devices. The communication interface(s) 809 and the network interface(s) 815 may be based on wired communication technology, and/or wireless communication technology, such as ZigBee®, WiMax®, WiFi®, Bluetooth® and/or cellular protocols, such as GSM®, etc.

The computing device 802 may also include one or more input devices 811 and one or more output devices 817. The input devices 811 and output devices 817 may facilitate user input/user output. Other components 813 may also be provided as part of the computing device 802.

Instructions 805a and data 807a may be stored in the memory 803. The processor 801 may load and execute instructions 805b from the instructions 805a in memory 803 to implement various functions. Executing the instructions 805a may involve the use of the data 807a that is stored in the memory 803. The instructions 805b and/or data 807b may be loaded onto the processor 801. The instructions 805 may be executable to implement one or more of the methods described herein, and the data 807 may include one or more of the various pieces of data described herein.

The memory 803 may be any electronic component capable of storing electronic information. The memory 803 may be embodied as random access memory (RAM), read-only memory (ROM), magnetic disk storage media, optical storage media, flash memory devices in RAM, on-board memory included with the processor, EPROM memory, EEPROM memory, an ASIC (Application Specific Integrated Circuit), registers, and so forth, including combinations thereof. The various components of the computing device 802 may be coupled together by a bus system 819, which may include a power bus, a control signal bus and a status signal bus, in addition to a data bus. However, for the sake of clarity, the various buses are illustrated in FIG. 8 as the bus system 819.

Figure 9:
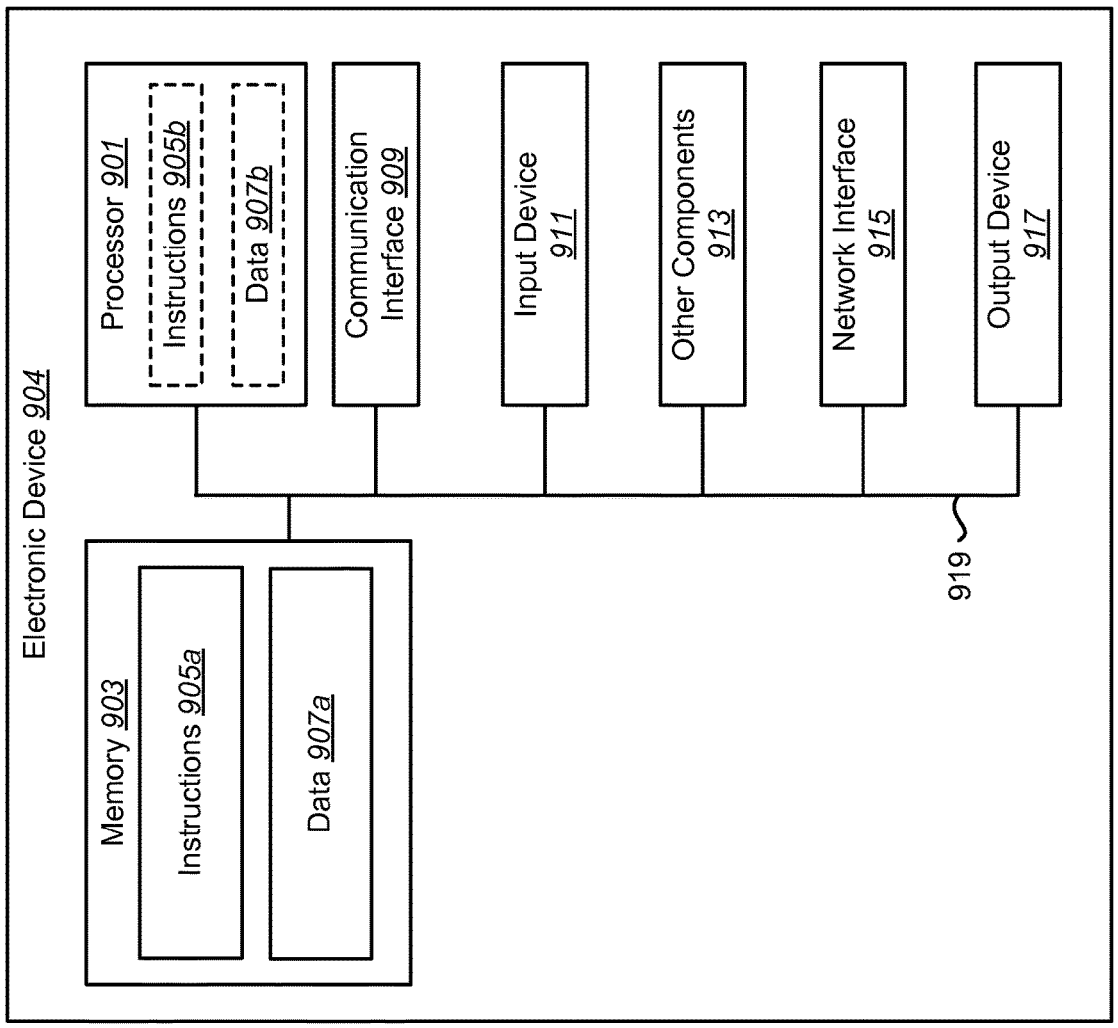
FIG. 9 is a block diagram illustrating various components that may be utilized in an electronic device.

FIG. 9 is a block diagram illustrating various components that may be utilized in an electronic device 904. One or more of the electronic devices described herein may be implemented in accordance with the electronic device 904 described in connection with FIG. 9. Although only the electronic device 904 is shown, the configurations herein may be implemented in a distributed system using many electronic devices. An electronic device 904 may include the broad range of digital computers, including microcontrollers, hand-held computers, personal computers, servers, mainframes, supercomputers, minicomputers, workstations and any variation or related device thereof. In some configurations, the electronic device 904 may be an appliance. Additionally or alternatively, the electronic device 904 may be an embedded device inside an otherwise complete device (e.g., within an appliance).

The electronic device 904 is shown with a processor 901 and memory 903. The processor 901 may control the operation of the electronic device 904 and may be embodied as a microprocessor, a microcontroller, a digital signal processor (DSP) or other device known in the art. The processor 901 typically performs logical and arithmetic operations based on program instructions 905a and/or data 907a stored within the memory 903. The instructions 905a in the memory 903 may be executable to implement one or more of the methods described herein. FIG. 9 illustrates instructions 905b and/or data 907b being loaded onto the processor 901. The instructions 905b and/or data 907b may be the instructions 905a and/or data 907a (or portions thereof) stored in memory 903.

The electronic device 904 may also include one or more communication interfaces 909 and/or network interfaces 915 for communicating with other electronic devices. The communication interface(s) 909 and the network interface(s) 915 may be based on wired communication technology, and/or wireless communication technology, such as ZigBee®, WiMax®, WiFi®, Bluetooth® and/or cellular protocols, such as GSM®, etc.

The electronic device 904 may also include one or more input devices 911 and one or more output devices 917. The input devices 911 and output devices 917 may facilitate user input/user output. Other components 913 may also be provided as part of the electronic device 904.

Instructions 905a and data 907a may be stored in the memory 903. The processor 901 may load and execute instructions 905b from the instructions 905a in memory 903 to implement various functions. Executing the instructions 905a may involve the use of the data 907a that is stored in the memory 903. The instructions 905b and/or data 907b may be loaded onto the processor 901. The instructions 905 are executable to implement the one or more methods shown herein, and the data 907 may include one or more of the various pieces of data described herein.

The memory 903 may be any electronic component capable of storing electronic information. The memory 903 may be embodied as random access memory (RAM), read-only memory (ROM), magnetic disk storage media, optical storage media, flash memory devices in RAM, on-board memory included with the processor, EPROM memory, EEPROM memory, an ASIC (Application Specific Integrated Circuit), registers, and so forth, including combinations thereof. The various components of the electronic device 904 may be coupled together by a bus system 919, which may include a power bus, a control signal bus and a status signal bus, in addition to a data bus. However, for the sake of clarity, the various buses are illustrated in FIG. 9 as the bus system 919.

In the above description, reference numbers have sometimes been used in connection with various terms. Where a term is used in connection with a reference number, it may refer to a specific element that is shown in one or more of the Figures. Where a term is used without a reference number, it may refer generally to the term without limitation to any particular Figure.

As used herein, the term "coupled" and other variations thereof may mean that one element is connected to another element directly or indirectly. For example, if a first element is coupled to a second element, the first element may be connected directly to the second element or may be connected to the second element through another element.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable or processor-readable statement(s). For example, the terms "instructions" and "code" may refer to one or more programs, routines, sub-routines, functions, procedures, etc. "Instructions" and "code" may comprise a single computer-readable statement or many computer-readable statements.

The term "computer-readable medium" refers to any available medium that can be accessed by a computer or processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. A computer-readable medium may be tangible and non-transitory. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A computing device for investigating a lighting load, comprising:
    a processor;
    memory in electronic communication with the processor; and
    instructions stored in memory, the instructions being executable to:
        request load driving data corresponding to a lighting load that is driven by an electronic device, wherein the electronic device drives the lighting load and obtains the load driving data in response to the request for the load driving data, wherein the electronic device is one of the group consisting of a light switch and a dimmer;
        receive, from the electronic device over a network, the load driving data, wherein the load driving data comprises waveform data, a power rating and a phase margin of the lighting load captured by the electronic device in response to the request for the load driving data;
        receive, from a fault detector of the electronic device, a number of fault conditions;
        obtain load characterization data based on the fault conditions and from comparing the load driving data to load information on a load information database to determine if the lighting load is a known load type;
        evaluate compatibility of the lighting load and the electronic device, wherein evaluating compatibility comprises determining whether the lighting load is compatible with the electronic device based on the waveform data captured by the electronic device and based on the number of fault conditions, and determining whether the lighting load is being driven efficiently by comparing the power rating and the phase margin of the lighting load to other load types in the load information database;
        adjust driving of the lighting load more efficiently by the electronic device by using the evaluating compatibility of the lighting load and the electronic device; and
        store the load driving data, the load characterization data and load compatibility data in the load information database to update a load entry in the load information database for the lighting load, wherein updating the load entry in the load information database comprises sharing the load information stored on the load information database with another device via the network.

2. The computing device of claim 1, wherein requesting and receiving the load driving data occurs over a remote connection.

3. The computing device of claim 1, wherein obtaining load characterization data comprises determining whether the load driving data corresponds to a known load type.

4. The computing device of claim 3, wherein if it is determined that the load driving data corresponds to the known load type, then obtaining load characterization data comprises obtaining load characterization data based on the known load type.

5. The computing device of claim 3, wherein if it is determined that the load driving data does not correspond to the known load type, then obtaining load characterization data comprises generating load characterization data based on the load driving data.

6. The computing device of claim 1, wherein if it is determined that the lighting load is compatible with the electronic device, then the instructions are further executable to update load information corresponding to the lighting load that is driven by the electronic device.

7. The computing device of claim 1, wherein if it is determined that the lighting load is not compatible with the electronic device, then evaluating compatibility further comprises determining at least one incompatibility factor.

8. The computing device of claim 1, wherein obtaining load characterization data of the lighting load comprises determining a load type corresponding to the lighting load.

9. The computing device of claim 1, wherein requesting load driving data further comprises instructing the electronic device to obtain a phase margin between a voltage waveform and a current waveform passing from the electronic device to the lighting load.

10. The computing device of claim 1, wherein the instructions are further executable to update load information corresponding to the lighting load that is driven by the electronic device.

11. A method for investigating a lighting load by a computing device, comprising:
   requesting load driving data corresponding to a lighting load that is driven by an electronic device, wherein the electronic device drives the lighting load and obtains the load driving data in response to the request for the load driving data, wherein the electronic device is one of the group consisting of a light switch and a dimmer;
   receiving, from the electronic device over a network, the load driving data, wherein the load driving data comprises waveform data, a power rating and a phase margin of the lighting load captured by the electronic device in response to the request for the load driving data;
   receiving, from a fault detector of the electronic device, a number of fault conditions;
   obtaining load characterization data based on the fault conditions and from comparing the load driving data to load information on a load information database to determine if the lighting load is a known load type;
   evaluating compatibility of the lighting load and the electronic device, wherein evaluating compatibility comprises determining whether the lighting load is compatible with the electronic device based on the waveform data captured by the electronic device and based on the number of fault conditions, and determining whether the lighting load is being driven efficiently by comparing the power rating and the phase margin of the lighting load to other load types in the load information database;
   adjusting driving of the lighting load more efficiently by the electronic device by using the evaluating compatibility of the lighting load and the electronic device; and
   storing the load driving data, the load characterization data and load compatibility data in the load information database to update a load entry in the load information database for the lighting load, wherein updating the load entry in the load information database comprises sharing the load information stored on the load information database with another device via the network.

12. The method of claim 11, wherein requesting and receiving the load driving data occurs over a remote connection.

13. The method of claim 11, wherein obtaining load characterization data of the lighting load comprises determining a load type corresponding to the lighting load.

14. A non-transitory tangible computer-readable medium for investigating a lighting load, the computer-readable medium comprising executable instructions for:
   requesting load driving data corresponding to a lighting load that is driven by an electronic device, wherein the electronic device drives the lighting load and obtains the load driving data in response to the request for the load driving data, wherein the electronic device is one of the group consisting of a light switch and a dimmer;
   receiving, from the electronic device over a network, the load driving data, wherein the load driving data comprises waveform data, a power rating and a phase margin of the lighting load captured by the electronic device in response to the request for the load driving data;
   receiving, from a fault detector of the electronic device, a number of fault conditions;
   obtaining load characterization data based on the fault conditions and from comparing the load driving data to load information on a load information database to determine if the lighting load is a known load type;
   evaluating compatibility of the lighting load and the electronic device, wherein evaluating compatibility comprises determining whether the lighting load is compatible with the electronic device based on the waveform data captured by the electronic device and based on the number of fault conditions, and determining whether the lighting load is being driven efficiently by comparing the power rating and the phase margin of the lighting load to other load types in the load information database;
   adjusting driving of the lighting load more efficiently by the electronic device by using the evaluating compatibility of the lighting load and the electronic device; and
   storing the load driving data, the load characterization data and load compatibility data in the load information database to update a load entry in the load information database for the lighting load, wherein updating the load entry in the load information database comprises sharing the load information stored on the load information database with another device via the network.

* * * * *